(12) United States Patent
Baek et al.

(10) Patent No.: US 9,202,794 B2
(45) Date of Patent: Dec. 1, 2015

(54) PAD STRUCTURE OF A SEMICONDUCTOR DEVICE, METHOD OF MANUFACTURING THE PAD STRUCTURE AND SEMICONDUCTOR PACKAGE INCLUDING THE PAD STRUCTURE

(71) Applicant: SAMSUNG Electronics Co., Ltd., Suwon-si, Gyeonggi-do (KR)

(72) Inventors: Nam-Gyu Baek, Namyangju-si (KR); Young-Min Lee, Asan-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 50 days.

(21) Appl. No.: 13/803,429

(22) Filed: Mar. 14, 2013

(65) Prior Publication Data

US 2013/0277833 A1 Oct. 24, 2013

(30) Foreign Application Priority Data

Apr. 19, 2012 (KR) ........................ 10-2012-0040832

(51) Int. Cl.
*H01L 23/48* (2006.01)
*H01L 23/52* (2006.01)
(Continued)

(52) U.S. Cl.
CPC ............ *H01L 24/16* (2013.01); *H01L 23/3192* (2013.01); *H01L 24/03* (2013.01); *H01L 24/05* (2013.01); *H01L 24/11* (2013.01); *H01L 24/48* (2013.01); *H01L 2224/02166* (2013.01); *H01L 2224/0391* (2013.01); *H01L 2224/0401* (2013.01); *H01L 2224/04042* (2013.01); *H01L 2224/05085* (2013.01); *H01L 2224/05552* (2013.01); *H01L 2224/05557* (2013.01); *H01L 2224/05558* (2013.01); *H01L 2224/05567* (2013.01); *H01L 2224/05624* (2013.01); *H01L 2224/13022* (2013.01); *H01L 2224/13099* (2013.01); *H01L 2224/45099* (2013.01); *H01L 2224/48453* (2013.01); *H01L 2224/48463* (2013.01)

(58) Field of Classification Search
CPC .............................. H01L 24/16; H01L 24/11
USPC .................... 257/737, E23.021, 774, E23.01, 257/E21.506, E23.011, E21.585, 773, 257/E21.499; 438/613, 586, 597, 618, 622, 438/643, 666

See application file for complete search history.

(56) References Cited

U.S. PATENT DOCUMENTS 5,497,033 A * 3/1996 Fillion et al. ................. 257/723
5,650,041 A 7/1997 Gotoh et al.
(Continued)

FOREIGN PATENT DOCUMENTS

EP 1755162 2/2007
JP 1991-096243 4/1991
(Continued)

*Primary Examiner* — Sheikh Maruf
(74) *Attorney, Agent, or Firm* — EIPG, PLLC

(57) ABSTRACT

A pad structure usable with a semiconductor device may include an insulating layer pattern structure, a plug, and a pad. The insulating layer pattern structure has a plug hole and at least one via hole. The plug is formed in the plug hole. The pad is formed on the insulating layer pattern structure. The pad is electrically connected with the plug and has a lower surface and an uneven upper surface. The lower surface includes a protruded portion inserted into the via hole. The uneven upper surface includes a recessed portion and an elevated portion- to provide high roughness and firm connection.

13 Claims, 13 Drawing Sheets

(51) Int. Cl.
*H01L 29/40* (2006.01)
*H01L 23/00* (2006.01)
*H01L 23/31* (2006.01)

(56) References Cited

U.S. PATENT DOCUMENTS

| | | |
|---|---|---|
| 7,807,512 B2 | 10/2010 | Lee et al. |
| 2002/0047184 A1 | 4/2002 | Alpern et al. |
| 2002/0192951 A1 | 12/2002 | Morita et al. |
| 2003/0230803 A1* | 12/2003 | Matsuo ............... 257/734 |
| 2004/0182604 A1 | 9/2004 | Alcoe |
| 2005/0098446 A1* | 5/2005 | Tsai et al. ............. 205/672 |
| 2007/0040186 A1* | 2/2007 | Fillion et al. ......... 257/177 |
| 2008/0142986 A1* | 6/2008 | Yasumori et al. ..... 257/773 |
| 2010/0201000 A1 | 8/2010 | Antol et al. |
| 2012/0032323 A1* | 2/2012 | Matsumoto et al. ... 257/737 |
| 2012/0044191 A1* | 2/2012 | Shin ..................... 345/174 |
| 2013/0140688 A1* | 6/2013 | Chen et al. ........... 257/737 |

FOREIGN PATENT DOCUMENTS

| | | |
|---|---|---|
| JP | 2005-236187 | 9/2005 |
| JP | 2011-146521 | 7/2011 |
| KR | 2003-0033249 | 5/2003 |
| KR | 10-2004-0093553 | 11/2004 |
| KR | 10-0734250 | 7/2007 |
| KR | 10-2008-0039097 | 5/2008 |
| KR | 10-0908986 | 7/2009 |

* cited by examiner

PAD STRUCTURE OF A SEMICONDUCTOR DEVICE, METHOD OF MANUFACTURING THE PAD STRUCTURE AND SEMICONDUCTOR PACKAGE INCLUDING THE PAD STRUCTURE

CROSS-REFERENCE TO RELATED APPLICATIONS

This application claims priority under 35 USC §119 to Korean Patent Application No. 2012-40832, filed on Apr. 19, 2012 in the Korean Intellectual Property Office (KIPO), the contents of which are herein incorporated by reference in their entirety.

BACKGROUND

1. Field

Example embodiments relate to a pad structure of a semiconductor device, a method of manufacturing the pad structure, and a semiconductor package including the pad structure. More particularly, example embodiments relate to a pad structure of a semiconductor device connected with a conductive connecting member for a package process, a method of manufacturing the pad structure, and a semiconductor package including the pad structure.

2. Description of the Related Art

Generally, a plurality of semiconductor fabrication processes may be performed on a semiconductor substrate to form semiconductor chips. In order to mount each of the semiconductor chips on a main board, a packaging process may be performed on the semiconductor chip to form a semiconductor package.

In the semiconductor package, the semiconductor chip may be connected with a package substrate via a conductive connecting member such as a conductive wire, a conductive bump, etc. Thus, the semiconductor chip may have a pad electrically connected to the conductive connecting member. The pad may be electrically connected with a semiconductor structure in the semiconductor chip. Electrical connection reliability may be mainly dependent upon a firm connection between the conductive wire and the pad.

However, the pad may have a flat upper surface connected to the conductive wire because a planarization process may be performed to form the pad. The flat upper surface of the pad may have low surface roughness. Thus, because a strong friction may not be generated between the flat upper surface of the pad and the conductive wire, the conductive wire may be detached from the flat upper surface of the pad.

Particularly, a prober may make contact with a pad, which may be used for testing electrical characteristics of the semiconductor package, among the pads, so that the prober may scratch the flat upper surface of the pad. Therefore, the conductive wire may be firmly connected to the scratched upper surface of the pad. In contrast, the prober may not make contact with the rest of the pads except for the pad used for the electrical test. Thus, the flat upper surface of the pads may still have the above-mentioned problem.

SUMMARY

Example embodiments provide a pad structure to which a conductive connecting member may be firmly connected.

Example embodiments also provide a method of manufacturing the above-mentioned pad structure.

Example embodiments still also provide a semiconductor package including the above-mentioned pad structure.

Additional features and utilities of the present general inventive concept will be set forth in part in the description which follows and, in part, will be obvious from the description, or may be learned by practice of the general inventive concept.

The foregoing and other features and utilities of the present general inventive concept may be achieved by providing a pad structure of a semiconductor device. The pad structure of the semiconductor device may include an insulating layer pattern structure, a plug and a pad. The insulating layer pattern structure may have a plug hole and at least one via hole. The plug may be formed in the plug hole. The pad may be formed on the insulating layer pattern structure. The pad may be electrically connected with the plug. The pad may have a lower surface and an uneven upper surface. The lower surface may have a protruded portion inserted into the via hole. The uneven upper surface may have a recessed portion and an elevated portion having an arrangement substantially the same as that of the protruded portion.

The recessed portion may be arranged in lengthwise and breadthwise directions substantially parallel to side surfaces of the pad, respectively. The elevated portion may be surrounded with the recessed portion.

The recessed portion and the elevated portion may be arranged slantly to side surfaces of the pad. The recessed portion and the elevated portion may have substantially the same width. Alternatively, the recessed portion may have a width greater than that of the elevated portion.

The elevated portion may be symmetrically arranged with respect to a center point of the pad. The elevated portion may be extended to adjacent side surfaces of the pad.

The pad may further have a second recessed portion formed at a central portion of the pad. The elevated portion may be arranged to surround the second recessed portion.

The recessed portion may be symmetrically arranged with respect to a center point of the pad.

The plug may be formed along an inner surface of the via hole.

The foregoing and other features and utilities of the present general inventive concept may also be achieved by providing a method of manufacturing a pad structure of a semiconductor device. In the method of manufacturing the pad structure of the semiconductor device, an insulating layer may be patterned to form an insulating layer pattern structure having a plug hole and at least one via hole. A plug may be formed in the plug hole. A pad may be formed on the insulating layer pattern structure to fill up the via hole. The pad may be electrically connected with the plug. A recessed portion and an elevated portion may be formed at an upper surface of the pad. The recessed portion and the elevated portion may have an arrangement substantially the same as that of the via hole.

The forming of the plug in the plug hole may include forming the plug along an inner surface of the via hole.

The method may further include forming a passivation layer pattern on the insulating layer pattern structure. The passivation layer pattern may have an opening configured to expose the upper surface of the pad.

The foregoing and other features and utilities of the present general inventive concept may also be achieved by providing a semiconductor package. The semiconductor package may include a package substrate, a semiconductor chip and a conductive connecting member. The semiconductor chip may be arranged on the package substrate. The semiconductor chip may have a pad. The pad may include an insulating layer pattern structure, a plug and a pad. The insulating layer pattern structure may have a plug hole and at least one via hole. The plug may be formed in the plug hole. The pad may be formed on the insulating layer pattern structure. The pad may be electrically connected with the plug. The pad may have a lower surface and an uneven upper surface. The lower surface may have a protruded portion inserted into the via hole. The uneven upper surface may have a recessed portion and an elevated portion having an arrangement substantially the same as that of the protruded portion. The conductive connecting member may be electrically connected between the pad of the semiconductor chip and the package substrate.

The conductive connecting member may include a conductive wire, a conductive bump, etc.

According to example embodiments, the upper surface of the pad may have the recessed portion of the elevated portion having the arrangement corresponding to the arrangement of the via hole in the insulating layer pattern structure. Thus, the uneven upper surface of the pad may have high roughness, so that the conductive connecting member may be firmly connected to the uneven upper surface of the pad. Particularly, because the uneven upper surface of the pad may increase a contact area between the pad and the conductive connecting member, a firm connection between the pad and the conductive connecting member may be ensured.

The foregoing and other features and utilities of the present general inventive concept may also be achieved by providing a pad structure usable with a semiconductor device, the pad structure including a first insulation layer pattern, a second insulating layer pattern formed on the first insulation layer pattern and having a plug hole and at least one via hole, a plug formed in the plug hole, and a pad disposed on the second insulating layer pattern and electrically connected to the plug, and having a main portion, a protruding portion formed on a first side of the main portion and disposed in the at least one via hole, and an uneven surface portion formed on a second side of the main portion such that a first tie is formed between the via hole of the first insulating layer pattern and the protruding portion of the pad, and a second tie is formed between the uneven surface portion of the pad and an external conductive structure.

The pad structure may further include a semiconductor structure connected to the plug disposed in the plug hole of the first insulating layer pattern; and a liner layer formed on the via hole to be electrically connected to the plug or electrically connected to the protruding of the pad.

The uneven surface portion of the pad may include a first area formed with one or more elevated portions and a second area formed with one or more recessed portions.

The elevated portions and the recessed portions may be disposed to form an uneven surface and may be physically and electrically connected to the external conductive structure.

The foregoing and other features and utilities of the present general inventive concept may also be achieved by providing a semiconductor package comprising a package substrate, a conductive wire or bump as an external conductive structure, and the above described pad structure.

BRIEF DESCRIPTION OF THE DRAWINGS

These and/or other features and utilities of the present general inventive concept will become apparent and more readily appreciated from the following description of the embodiments, taken in conjunction with the accompanying drawings of which.

DETAILED DESCRIPTION OF THE PREFERRED EMBODIMENTS

Figure 1:
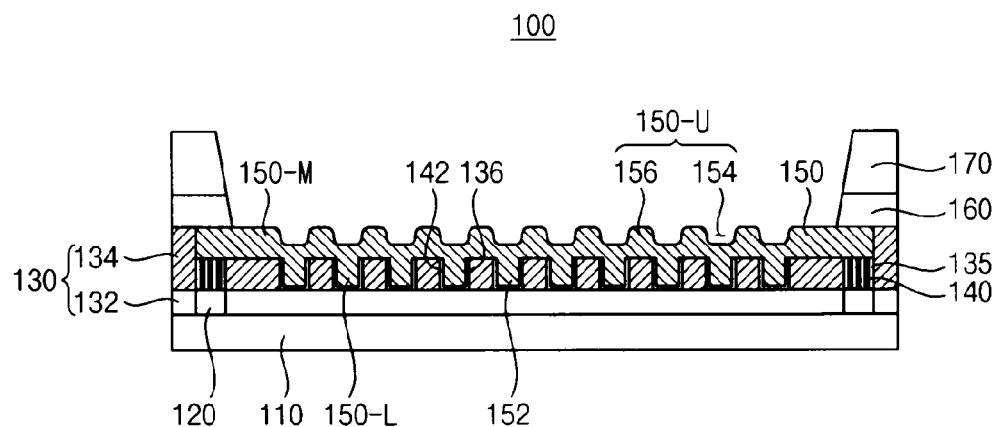
FIG. 1 is a cross-sectional view illustrating a pad structure of a semiconductor device according to an embodiment of the present general inventive concept.

Reference will now be made in detail to the embodiments of the present general inventive concept, examples of which are illustrated in the accompanying drawings, wherein like reference numerals refer to the like elements throughout. The embodiments are described below in order to explain the present general inventive concept while referring to the figures. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

Figure 2:
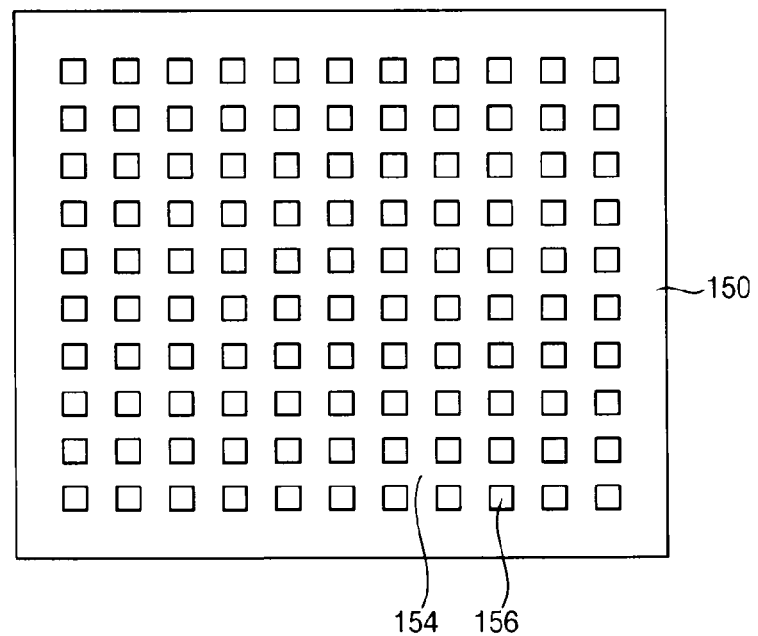
FIG. 2 is a plan view illustrating an upper surface of a pad of the pad structure of FIG. 1.

FIG. 1 is a cross-sectional view illustrating a pad structure 100 usable with a semiconductor device according to an exemplary embodiment of the present general inventive concept, and FIG. 2 is a plan view illustrating an upper surface of a pad of the pad structure 100 of FIG. 1.

Referring to FIG. 1, the pad structure 100 of a semiconductor device according to an exemplary embodiment may include an insulating layer pattern structure 130, a plug 140 and a pad 150.

The insulating layer pattern structure 130 may be formed on an upper surface of a semiconductor substrate 110. In example embodiments, a semiconductor structure 120 may be formed in the semiconductor substrate 110. For example, the semiconductor structure 120 may include an upper wiring of the semiconductor device.

The insulating layer pattern structure 130 may include a first insulating layer pattern 132 and a second insulating layer pattern 134. The first insulating layer pattern 132 may be formed on the upper surface of the semiconductor substrate 110. The first insulating layer pattern 132 may have an opening configured to receive the semiconductor structure 120. Thus, the semiconductor structure 120 may have an upper surface exposed through the opening of the first insulating layer pattern 132. In an exemplary embodiment, the upper surface of the semiconductor structure 120 may be substantially coplanar with an upper surface of the first insulating layer pattern 132.

The second insulating layer pattern 134 may be formed on the upper surface of the first insulating layer pattern 134 to cover the upper surface of the semiconductor structure 120. In example embodiments, the second insulating layer pattern 134 may have a plug hole 135 and a plurality of via holes 136. The second insulating layer pattern 134 may have a side portion and a main portion. The side portion and the main portion may have different heights from the first insulating layer pattern or the semiconductor substrate 110. The side portion may have a height higher in a direction perpendicular to a major surface of the first insulating layer pattern or the semiconductor than a thickness of the side portion in a direction parallel to a major surface of the first insulating layer pattern or the semiconductor substrate 110.

The plug hole 135 may be vertically formed through an edge portion of the second insulating layer pattern 134. The upper surface of the semiconductor structure 120 may be exposed through the plug hole 135.

The via holes 136 may be vertically formed through a central portion of the second insulating layer pattern 134. In example embodiments, the upper surface of the first insulating layer pattern 132 may be exposed through the via holes 136. That is, the via holes 136 may have a depth substantially the same as a thickness of the main portion of the second insulating layer pattern 134. Alternatively, the upper surface of the first insulating layer pattern 134 may not be exposed through the via holes 136. In this case, the via holes 136 may have a depth less than the thickness of the main portion of the second insulating layer pattern 134.

The plug 140 may be formed in the plug hole 135. In example embodiments, the plug hole 135 may be fully filled with the plug 140. Thus, the plug 140 may have a lower surface configured to make contact with the upper surface of the semiconductor structure 120. Further, the plug 140 may have an upper surface exposed by the second insulating layer pattern 134. The upper surface of the plug 140 may be substantially coplanar with the upper surface of the main portion of the second insulating layer pattern 134.

Additionally, the plug 140 may further include a liner layer 142 formed on inner surfaces of the via holes 136. In example embodiments, the liner layer 142 may be simultaneously formed when the plug 140 is formed. That is, during filling the plug hole 135 with the plug 140, the liner layer 142 may also be formed on the inner surfaces of the via holes 136. Therefore, the plug 140 and the liner layer 142 may include substantially the same material. For example, the plug 140 and the liner layer 142 may include a material having good gap-filling characteristic capable of fully filling the plug hole 135 such as tungsten.

The pad 150 may be formed on the upper surface of the second insulating layer pattern 134. The pad 140 may have an edge portion of a lower surface configured to make contact with the plug 140. Thus, the pad 140 may be electrically connected with the semiconductor structure 120 via the plug 140. In an exemplary embodiment, the pad 150 may include a material having gap-filling characteristic less than that of the material of the plug 140 such as aluminum.

In an exemplary embodiment, in a deposition process for forming the pad 150, the pad 150 may have a profile corresponding to an upper profile of the second insulating layer pattern 134. Thus, the lower surface of the pad 150 may have protruded portions 152 configured to protrude toward the first insulating layer pattern 132 to fully fill the via holes 136. Further, an upper surface of the pad 150 may have recessed portions 154 at positions of the upper surface of the pad 150 corresponding to positions of the protruded portions 152. Therefore, elevated portions 156 may be formed between the recessed portions 154 according to a characteristic of the pad 150 or a manufacturing process of the pad 150. As a result, the upper surface of the pad 150 may have an uneven shape including the recessed portions 154 and the elevated portions 156. For example, the upper surface of the pad 150 may have an embossing structure. That is, the upper surface of the pad 150 may have a structure corresponding to an arrangement of the via holes 136 of the second insulating layer pattern 134.

In an exemplary embodiment, because the upper surface of the pad 150 may have the uneven shape formed by the recessed portions 154 and the elevated portions 156, the uneven upper surface of the pad 150 may have high roughness. Therefore, a friction force may be increased due to the high roughness between the upper surface of the pad 150 and a conductive connecting member (not illustrated), such as a conductive wire, a conductive bump, etc., which may be connected to the uneven upper surface of the pad 150. As a result, the uneven upper surface of the pad 150 to support the conductive connecting member may be reinforced. It is possible that a capillary through which the conductive wire may be drawn may make contact with the uneven upper surface of the pad 150. The capillary may destroy, remove, or prevent a native oxide layer formed on the upper surface of the pad 150 due to the increased friction force. Thus, electrical connection reliability between the conductive wire and the pad 150 may be improved. Further, the uneven upper surface of the pad 150 may function as to enlarge a contact area between the conductive connecting member and the pad 150. Thus, a bonding strength may be reinforced between the pad 150 and the conductive connecting member.

In an exemplary embodiment, the pad 150 may correspond to a pad having a flat upper surface with which a prober to test electrical characteristics of a semiconductor package may not make contact. Alternatively, the pad 150 may include a pad having a scratched upper surface generated by the prober as well as the pad having the flat upper surface.

The pad 150 may have a main portion 150-M, a first portion 150-L, and a second portion 150-U. The main portion 150-M electrically connected to the semiconductor structure 120 through the plug 140. The first portion 150-L may be extended from the main portion 150-M and may correspond to the protruding portion 152. The second portion 150-U may be extended from the main portion 150-M and may include the recessed portions 154 and the elevated portions 156. The pad structure 100 may have a first tie formed between the first portion 150-L of the pad 150 and the via holes 136 of the second insulating layer patter 134 and may have a second tie formed between the conductive connecting member and the second portion 150-U of the pad 150, for example, the recessed portions 154 and the elevated portions 156 of the pad 150. The first tie may be a physical connection. The second tie may be a physical and electrical connection.

The pad structure 100 may further include one or more additional layer patterns 160 and 170 formed on the second insulating layer pattern 134 and/or the pad 150 to provide a space to access or to surround a major portion of the elevated portions 156 and the recessed portions 154 of the pad 150.

FIG. 2 is a plan view illustrating the recessed portions 154 and the elevated portions 156 formed on the upper surface of the pad 150 of FIG. 1. Referring to FIG. 2, the pad 150 may have a rectangular shape. Thus, the pad 150 may have four side surfaces.

The recessed portions 154 may have a lattice structure where the recessed portions 154 are arranged in lengthwise and/or breadthwise directions substantially parallel to the side surfaces of the pad 150. Thus, each of the elevated portions 156 may have a rectangular shape surrounded by the recessed portions 154. The conductive connecting member may have a lower end configured to be received in the latticed recessed portions 154, so that the lower end of the conductive connecting member may be firmly supported by the elevated portion 156.

A passivation layer pattern 160 and a polyimide layer pattern 170 may be sequentially formed on the upper surface of the second insulating layer pattern 134. The passivation layer pattern 160 and the polyimide layer pattern 170 may have openings configured to expose the uneven upper surface of the pad 150.

FIGS. 3 to 6 are cross-sectional views illustrating a method of manufacturing the pad structure 100 of FIG. 1.

Figure 3:
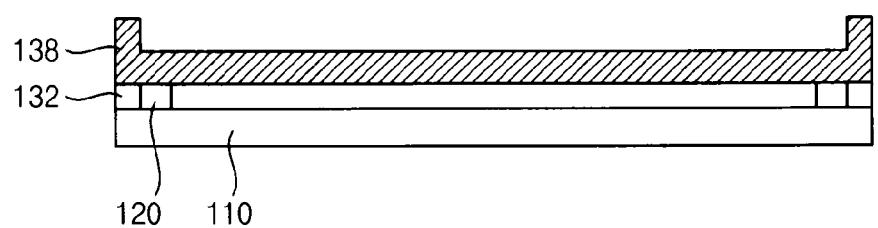
FIGS. 3 to 6 are cross-sectional views illustrating a method of manufacturing the pad structure of FIG. 1.

Referring to FIG. 3, the insulating layer pattern structure 130 may be formed on the upper surface of the semiconductor substrate 110. In an exemplary embodiment, the first insulating layer pattern 132 may be formed on the upper surface of the semiconductor substrate 110. The first insulating layer pattern 132 may have an opening configured to expose the semiconductor structure 120. An insulating material layer 138 may be formed on an upper surface of the first insulating layer pattern 132 to form the second insulating layer pattern 134.

Figure 4:
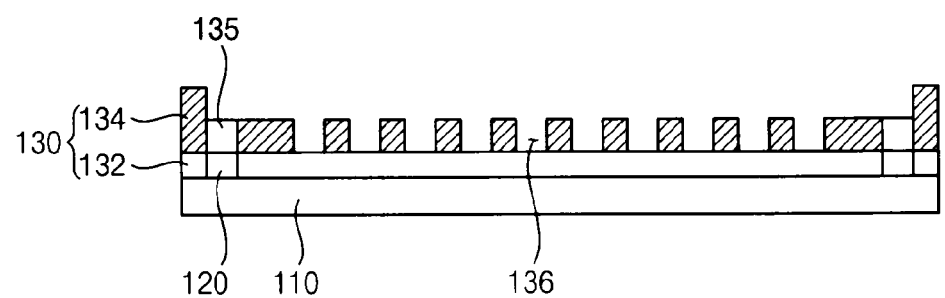

Referring to FIG. 4, a photoresist pattern (not illustrated) may be formed on an upper surface of the insulating material layer 138. The insulating material layer 138 may be etched using the photoresist pattern as an etch mask to form the second insulating layer pattern 134 having the plug hole 135 and the via holes 136. The semiconductor structure 120 may be exposed through the plug hole 135. In an exemplary embodiment, the via holes 136 may be extended in the lengthwise and breadthwise directions.

Figure 5:
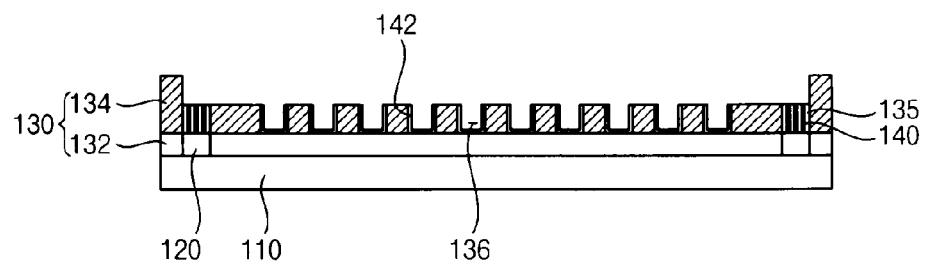

Referring to FIG. 5, a plug layer (not illustrated) may be formed on the upper surface of the second insulating layer pattern 134. The plug layer may make contact with the semiconductor structure 120. The plug hole 135 may be fully filled with the plug layer. It is possible that the plug layer may be formed on inner surfaces of the via holes 136.

An upper surface of the plug layer may be planarized until the upper surface of the second insulting layer pattern 134 may be exposed to form the plug 140 in the plug hole 135 and the liner layer 142 on the inner surfaces of the via holes 136. In an exemplary embodiment, the plug layer may be planarized by a chemical mechanical polishing (CMP) process.

Figure 6:
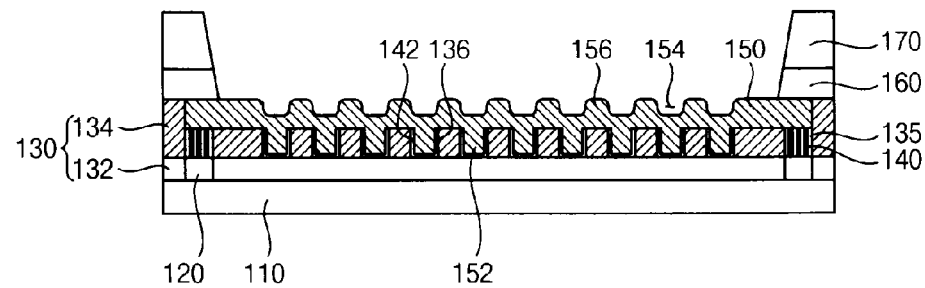

Referring to FIG. 6, the pad 150 may be formed on the upper surface of the second insulating layer pattern 134 by a process for forming a metal layer. An edge portion of the lower surface of the pad 150 may make contact with the plug 140. Further, the protruded portions 152 may be formed on a central portion of the lower surface of the pad 150. The via holes 136 may be fully filled with the protruded portions 152.

In an exemplary embodiment, the metal layer formed by a deposition process may have a uniform thickness. Therefore, the metal layer may have a profile substantially the same as that of the second insulating layer pattern 134 having the via holes 136. As a result, because the via holes 136 may be fully filled with the protruded portions 152, the recessed portions 154 may be formed at portions of the upper surface of the pad 150 above the protruded portions 152 according to the process of forming the protruded portions to correspond to the corresponding recessed portions 154. Further, the elevated portions 156 may be positioned between the recessed portions 154 accordingly. As a result, the upper surface of the pad 150 may have the uneven shape including the recessed portions 154 and the elevated portions 156 alternately arranged.

The passivation layer pattern 160 and the polyimide layer pattern 170 having the opening configured to expose the uneven upper surface of the pad 150 may be sequentially formed on the upper surface of the second insulating layer pattern 134 to complete the pad structure 100 of FIG. 1.

According to this example embodiment, the upper surface of the pad 150 may have the uneven shape formed by the recessed portions and the elevated portions having the latticed structure. Thus, the conductive connecting member may be received in the recessed portion extended in the lengthwise and the breadthwise directions, so that the boning strength between the conductive connecting member and the pad may be greatly reinforced.

Figure 7:
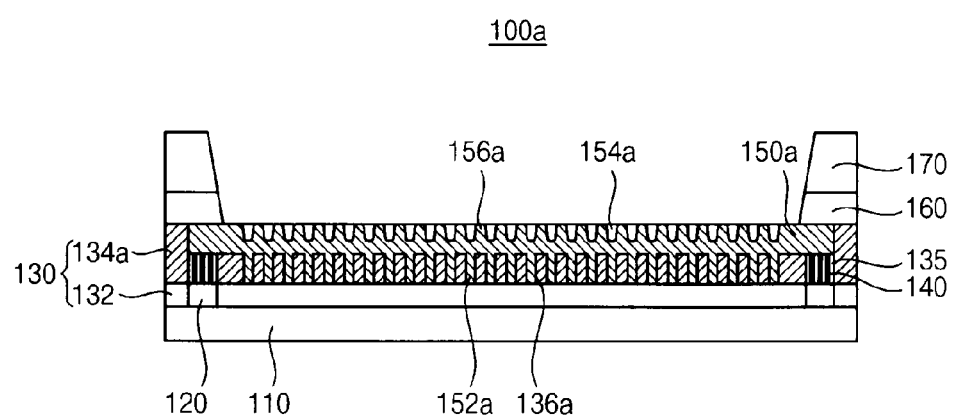
FIG. 7 is a cross-sectional view illustrating a pad structure of a semiconductor device according to an embodiment of the present general inventive concept.
Figure 8:
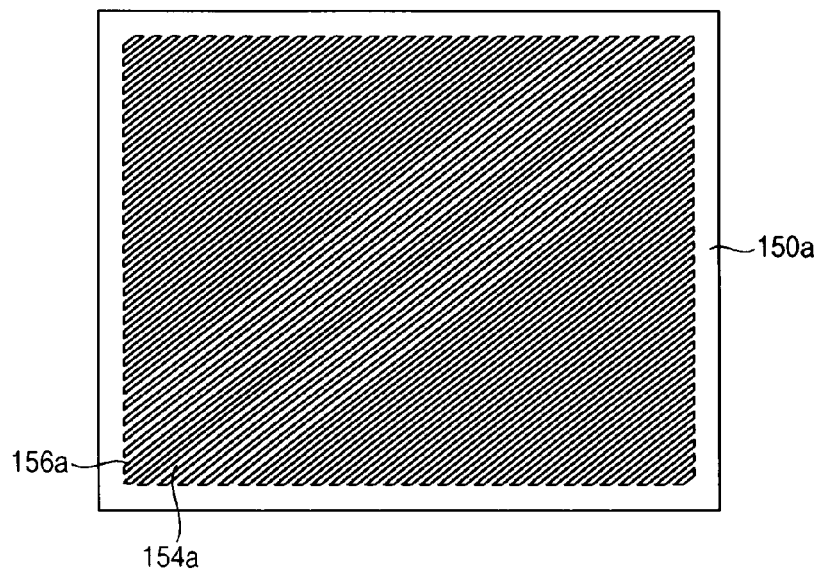
FIG. 8 is a plan view illustrating an upper surface of a pad of the pad structure of FIG. 7.

FIG. 7 is a cross-sectional view illustrating a pad structure 100a usable with a semiconductor device according to an embodiment of the present general inventive concept, and FIG. 8 is a plan view illustrating an upper surface of a pad of the pad structure 100a of FIG. 7.

The pad structure 100a of the exemplary embodiment may include elements substantially the same as those of the pad structure 100 in FIGS. 1 and 2 except for a second insulating layer pattern and a pad. Thus, the same reference numerals may refer to the same elements and any further illustrations with respect to the same element may be omitted herein for brevity.

Referring to FIGS. 7 and 8, recessed portions 154a and elevated portions 156a may be arranged slantly to side surfaces of a pad 150a. In example embodiments, the recessed portions 154a and the elevated portions 156a may have substantially the same width. Thus, the conductive connecting member and an uneven upper surface of the pad 150a may be engaged with each other. The slant recessed portions 154a and the slant elevated portions 156a may be formed by arranging via holes 136a in a second insulating layer pattern 134a and protruded portions 152a inserted into the via holes 136a.

According to the exemplary embodiment, an external force may be applied to the conductive connecting member in a direction substantially perpendicular to the side surfaces of the pad. Therefore, the slant recessed portions and the slant elevated portions may firmly support the conductive connecting member.

Figure 9:
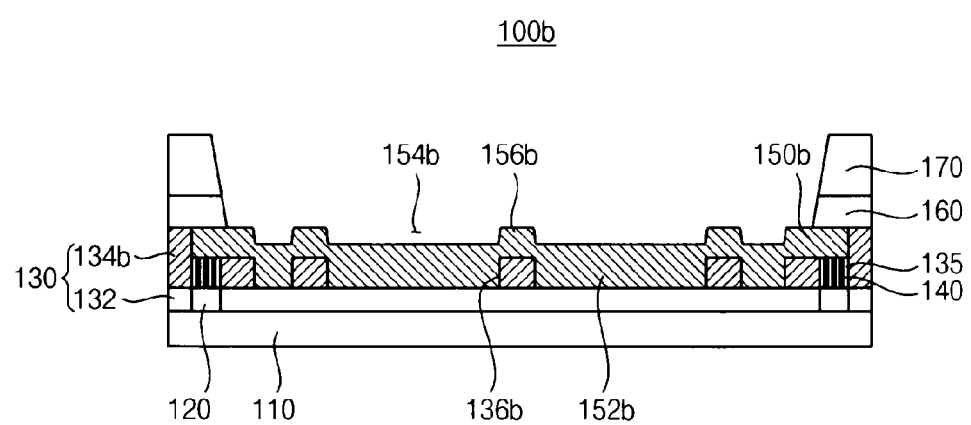
FIG. 9 is a cross-sectional view illustrating a pad structure of a semiconductor device according to an embodiment of the present general inventive concept.
Figure 10:
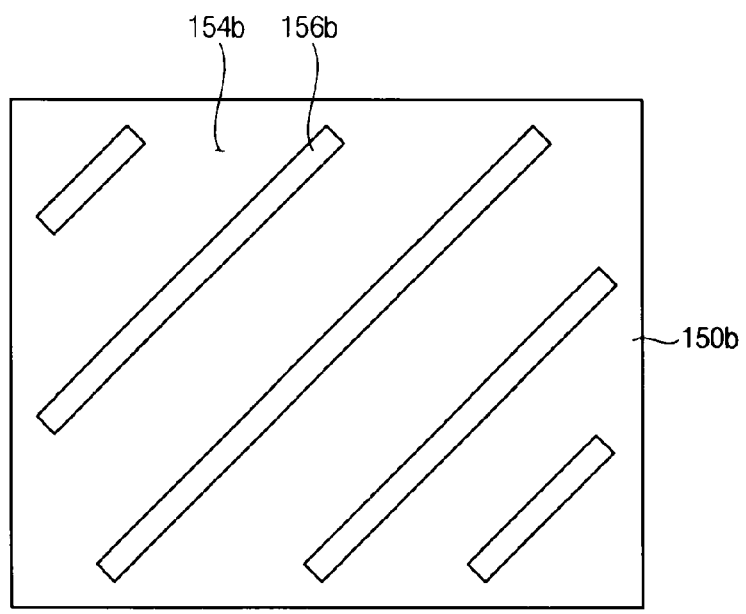
FIG. 10 is a plan view illustrating an upper surface of a pad of the pad structure of FIG. 9.

FIG. 9 is a cross-sectional view illustrating a pad structure 100b usable with a semiconductor device according to an embodiment of the present general inventive concept, and FIG. 10 is a plan view illustrating an upper surface of a pad of the pad structure 100b of FIG. 9.

The pad structure 100b of the exemplary embodiment may include elements substantially the same as those of the pad structure 100a in FIGS. 7 and 8 except for a second insulating layer pattern and a pad. Thus, the same reference numerals may refer to the same elements and any further illustrations with respect to the same element may be omitted herein for brevity.

Referring to FIGS. 9 and 10, recessed portions 154b may have a width greater than that of elevated portions 156b. The slant recessed portions 154b and the slant elevated portions 156b may be formed by arranging via holes 136b in a second insulating layer pattern 134b and protruded portions 152b inserted into the via holes 136b.

According to the exemplary embodiment, the conductive connecting member may have a lower end received in the recessed portion 154b having a volume relatively greater than that a lower end of the conductive connecting member received in the recessed portion 152a in FIGS. 7 and 8. Therefore, a relatively great amount of the lower end of the conductive connecting member may be firmly supported by the elevated portion 156b.

Figure 11:
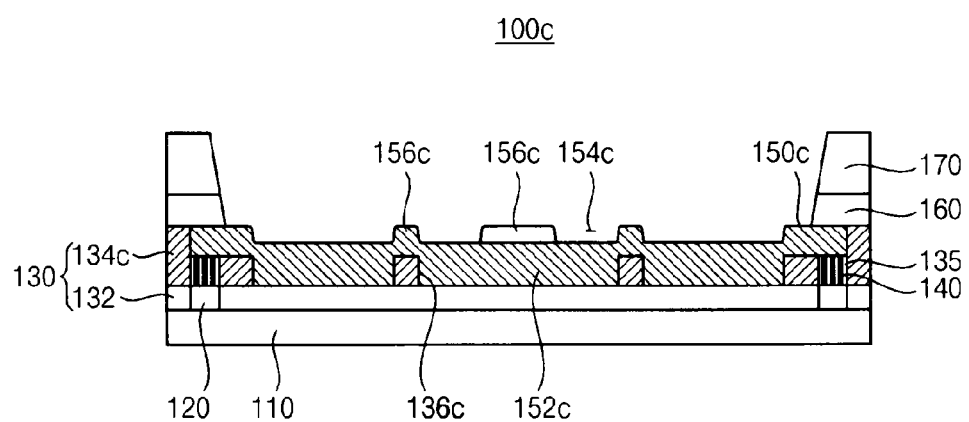
FIG. 11 is a cross-sectional view illustrating a pad structure of a semiconductor device according to an embodiment of the present general inventive concept.
Figure 12:
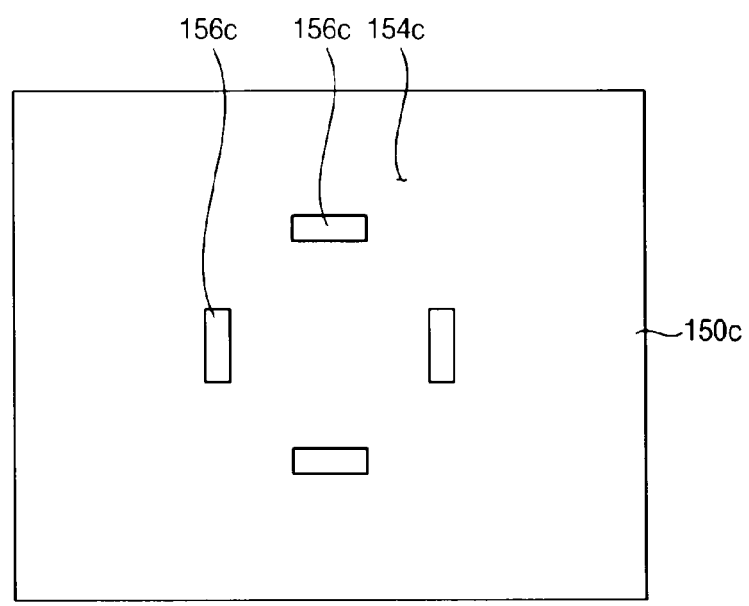
FIG. 12 is a plan view illustrating an upper surface of a pad of the pad structure of FIG. 11.

FIG. 11 is a cross-sectional view illustrating a pad structure 100c usable with a semiconductor device according to an embodiment of the present general inventive concept, and FIG. 12 is a plan view illustrating an upper surface of a pad of the pad structure 100c of FIG. The pad structure 100c of the exemplary embodiment may include elements substantially the same as those of the pad structure 100 in FIGS. 1 and 2 except for a second insulating layer pattern and a pad. Thus, the same reference numerals may refer to the same elements and any further illustrations with respect to the same element may be omitted herein for brevity.

Referring to FIGS. 11 and 12, four elevated portions 156c may surround a center area of a pad 150c. The area of the upper surface of the pad 150c except for the four elevated portions 156c may correspond to a recessed portion 154c. In an exemplary embodiment, the elevated portions 156c may have a rectangular frame shape. That is, the elevated portions 156c may be arranged in a direction substantially perpendicular to a direction of the external force applied to the conductive connecting member. The recessed portion 154c and the elevated portions 156c may be formed by arranging via holes 136c in a second insulating layer pattern 134c and protruded portions 152c inserted into the via holes 136c.

According to this example embodiment, the elevated portions 156c may mitigate the external force applied to the conductive connecting member in the elevated portions 156c. Therefore, the elevated portions may firmly support the conductive connecting member.

Figure 13:
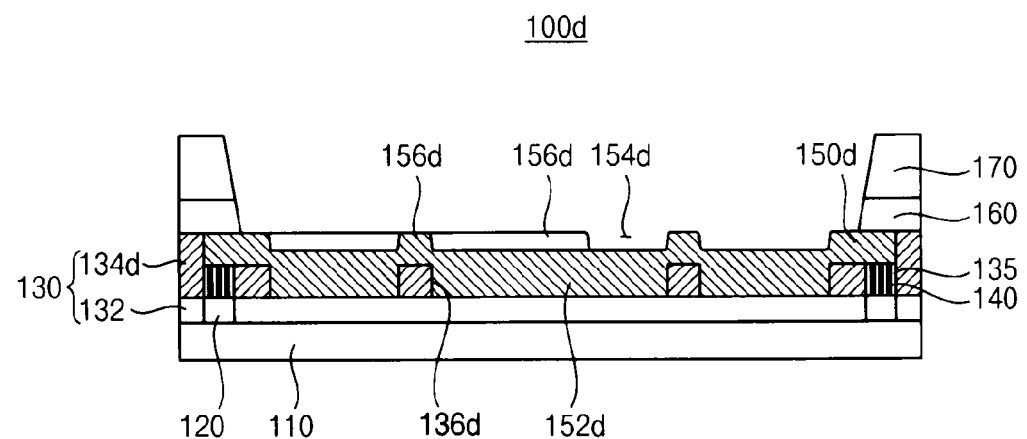
FIG. 13 is a cross-sectional view illustrating a pad structure of a semiconductor device according to an embodiment of the present general inventive concept.
Figure 14:
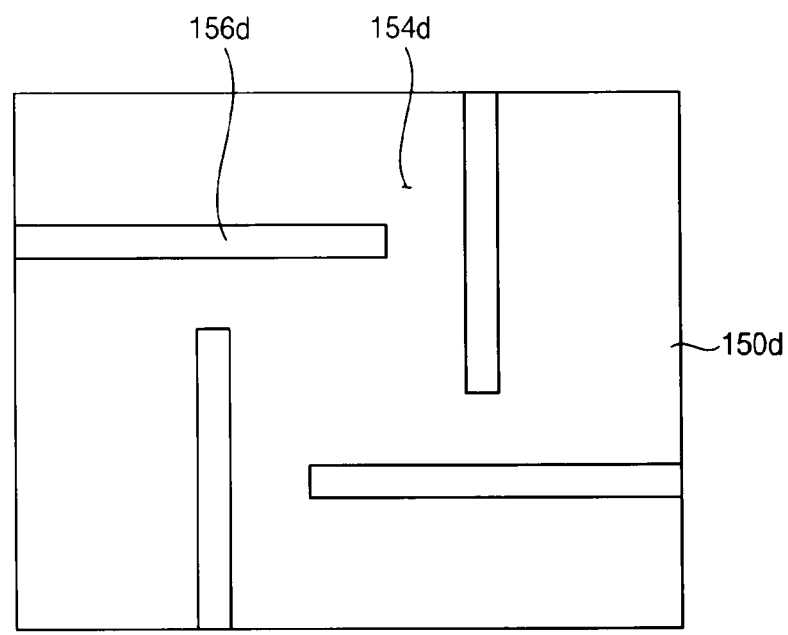
FIG. 14 is a plan view illustrating an upper surface of a pad of the pad structure of FIG. 13.

FIG. 13 is a cross-sectional view illustrating a pad structure 100d usable with a semiconductor device according to an embodiment of the present general inventive concept, and FIG. 14 is a plan view illustrating an upper surface of a pad of the pad structure 100d of FIG. 13.

The pad structure 100d of the exemplary embodiment may include elements substantially the same as those of the pad structure 100c in FIGS. 11 and 12 except for a second insulating layer pattern and a pad. Thus, the same reference numerals may refer to the same elements and any further illustrations with respect to the same element may be omitted herein for brevity.

Referring to FIGS. 13 and 14, elevated portions 156d may be extended to adjacent side surfaces of a pad 150d. Thus, each of the elevated portions 156d may have a length longer than that of the elevated portion 156c in FIGS. 11 and 12. As a result, the long elevated portions 156d may firmly support a conductive connecting member in a recessed portion 154d. The recessed portion 154d and the elevated portions 156d may be formed by arranging via holes 136d in a second insulating layer pattern 134d.

The elevated portion 156d may be extended from a side of the pad 150 toward an opposite side of the pad 150. Since another elevated portion 156d is disposed in a direction perpendicular to the extension direction of the elevated portion 156d between the elevated portion 156d and the opposite side of the pad 150, the elevated portion 156d may not contact the opposite side of the pad 150.

Figure 15:
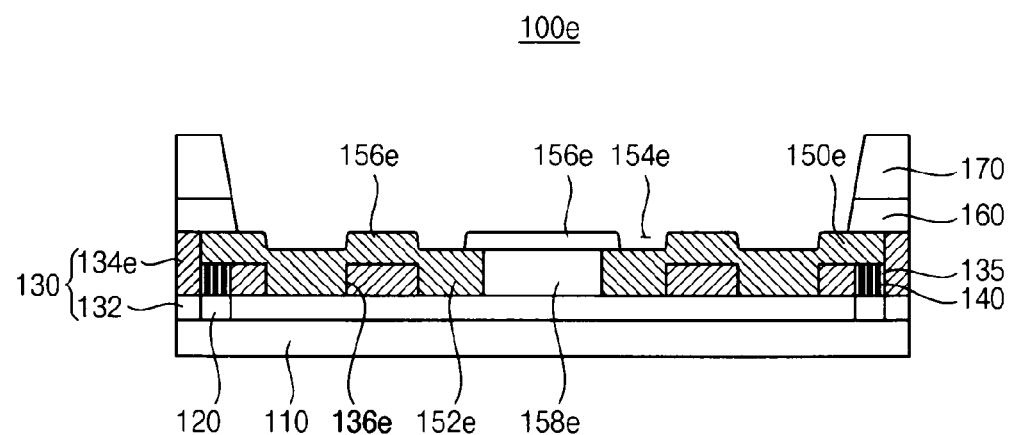
FIG. 15 is a cross-sectional view illustrating a pad structure of a semiconductor device according to an embodiment of the present general inventive concept.
Figure 16:
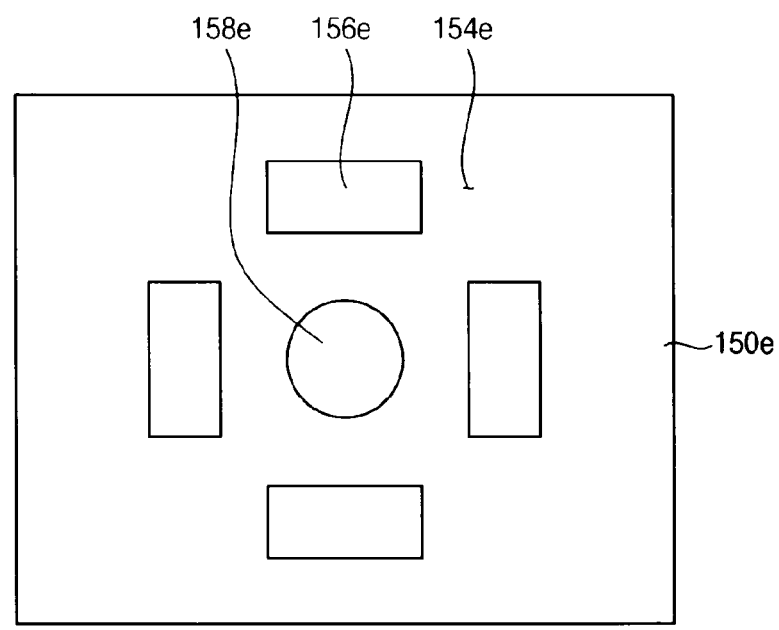
FIG. 16 is a plan view illustrating an upper surface of a pad of the pad structure of FIG. 15.

FIG. 15 is a cross-sectional view illustrating a pad structure 100e usable with a semiconductor device according to an embodiment of the present genera inventive concept, and FIG. 16 is a plan view illustrating an upper surface of a pad of the pad structure 100e of FIG. 15.

The pad structure 100e of the exemplary embodiment may include elements substantially the same as those of the pad structure 100c in FIGS. 11 and 12 except for a second insulating layer pattern and a pad. Thus, the same reference numerals may refer to the same elements and any further illustrations with respect to the same element may be omitted herein for brevity.

Referring to FIGS. 15 and 16, a second recessed portion 158e may be formed between four elevated portions 156e having a rectangular frame shape. That is, the second recessed portion 158e may be formed at a central portion of an upper surface of a pad 150e. The second recessed portion 158e may be formed by removing the central portion of the upper surface of the pad 150e. In an exemplary embodiment, an upper surface of a second insulating layer pattern 134e may be exposed through the second recessed portion 158e. A recessed portion 154e, the second recessed portion 158e and the elevated portions 156e may be formed by arranging via holes 136e in a second insulating layer pattern 134e and protruded portions 152e inserted into the via holes 136e.

According to the exemplary embodiment, the conductive connecting member may be received in the second recessed portion 158e having a depth deeper than that of the recessed portion 154e, so that a bonding strength between the conductive connecting member and the pad 150e may be remarkably reinforced. Particularly, a lower end of the conductive connecting member received in the second recessed portion 158e may function as a pillar for firmly supporting the conductive connecting member.

Figure 17:
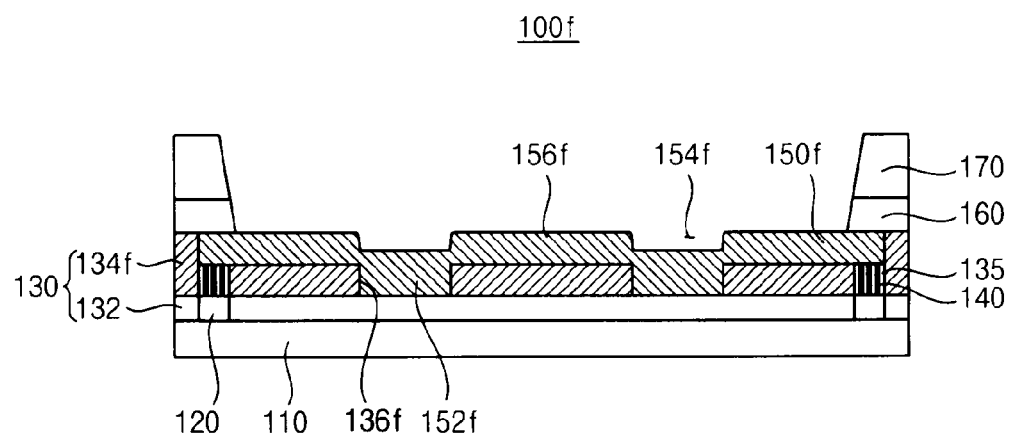
FIG. 17 is a cross-sectional view illustrating a pad structure of a semiconductor device according to an embodiment of the present general inventive concept.
Figure 18:
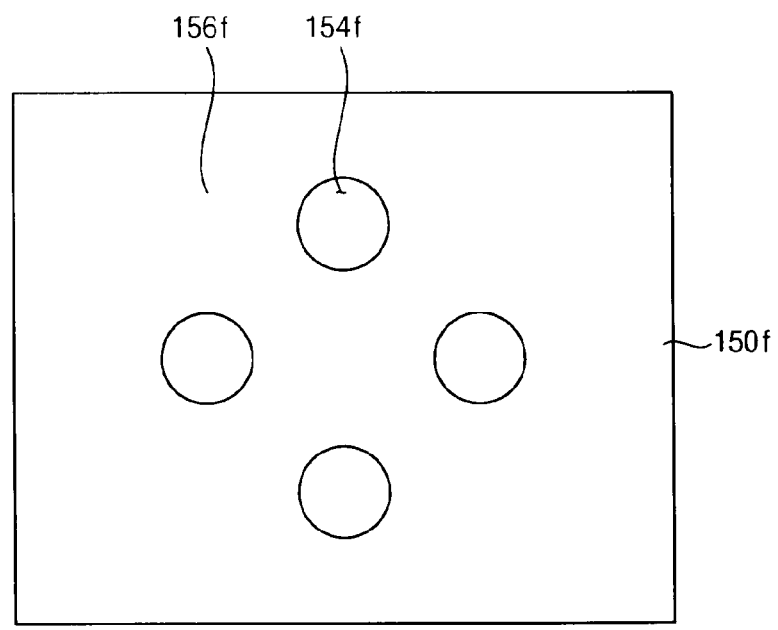
FIG. 18 is a plan view illustrating an upper surface of a pad of the pad structure of FIG. 17.

FIG. 17 is a cross-sectional view illustrating a pad structure 100f usable with a semiconductor device according to an embodiment of the present general inventive concept, and FIG. 18 is a plan view illustrating an upper surface of a pad of the pad structure 100f of FIG. 17.

The pad structure 100f of the exemplary embodiment may include elements substantially the same as those of the pad structure 100 in FIGS. 1 and 2 except for a second insulating layer pattern and a pad. Thus, the same reference numerals may refer to the same elements and any further illustrations with respect to the same element may be omitted herein for brevity.

Referring to FIGS. 17 and 18, four recessed portions 154f may be symmetrically arranged with respect to a center point of a pad 150f. Further, the recessed portions 154f may be arranged in a diagonal direction of the pad 150f. The rest portion of the upper surface of the pad 150f may correspond to an elevated portion 156f.

In an exemplary embodiment, the recessed portions 154f may have a depth configured to not expose a second insulating layer pattern 134f. That is, the depth of the recessed portion 154f may be shallower than a thickness of the pad 150f. The recessed portions 154f may be formed by arrangements and depths of via holes 136f in the second insulating layer pattern 134f and protruded portions 152f inserted into the via holes 136f.

Alternatively, the recessed portions 154f may have a depth configured to expose a second insulating layer pattern 134f. That is, the depth of the recessed portion 154f may be substantially the same as the thickness of the pad 150f. The recessed portions 154f may be formed by etching the pad 150f.

According to the exemplary embodiment, lower ends of the conductive connecting members received in the four recessed portions 154f may function as a pillar for firmly supporting the conductive connecting members. Therefore, bonding strength between the pad 150f and the conductive connecting member may be reinforced.

Figure 19:
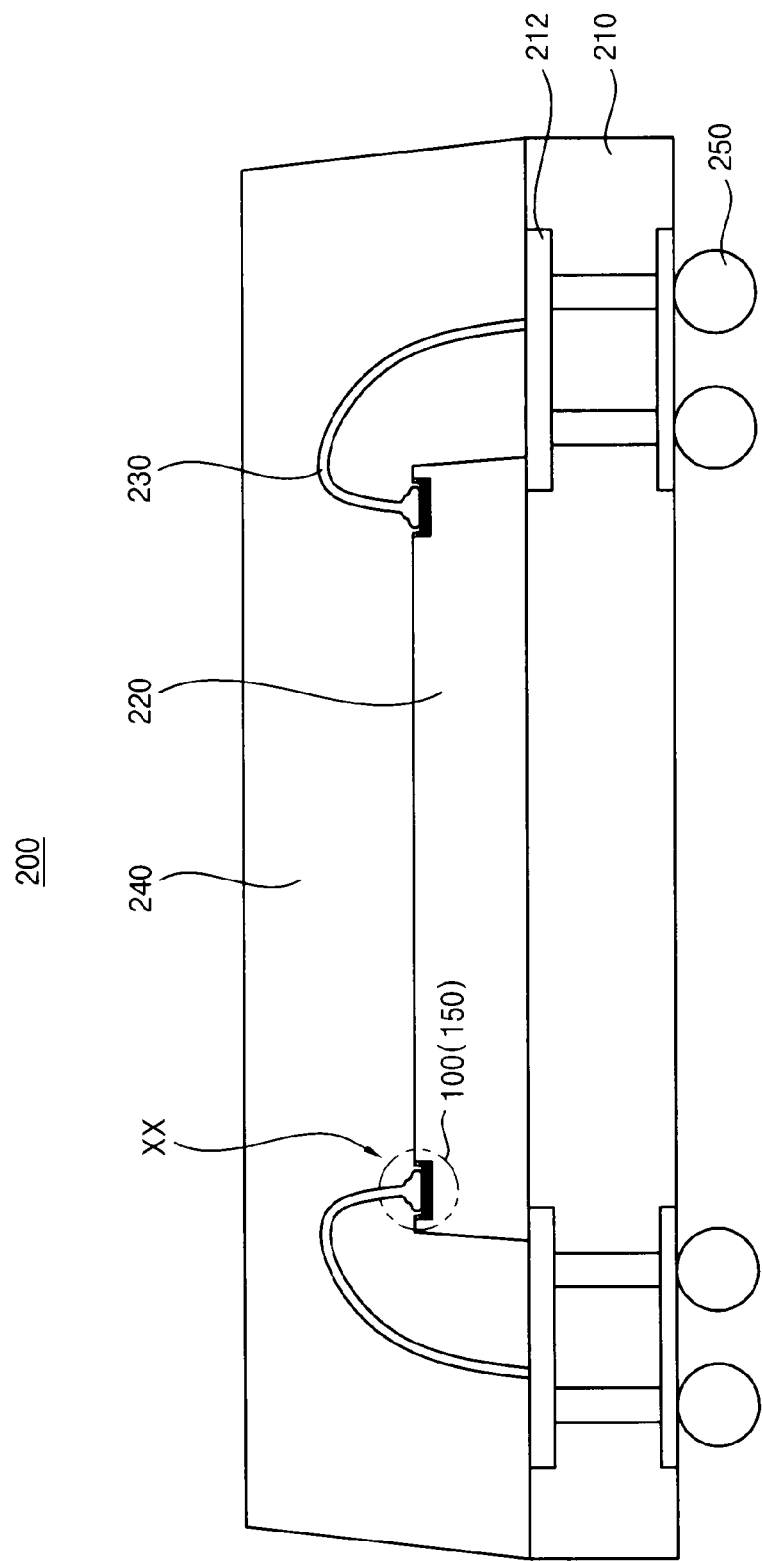
FIG. 19 is a cross-sectional view illustrating a semiconductor package including the pad structure in FIG. 1 in accordance with example embodiments according to an embodiment of the present general inventive concept.
Figure 20:
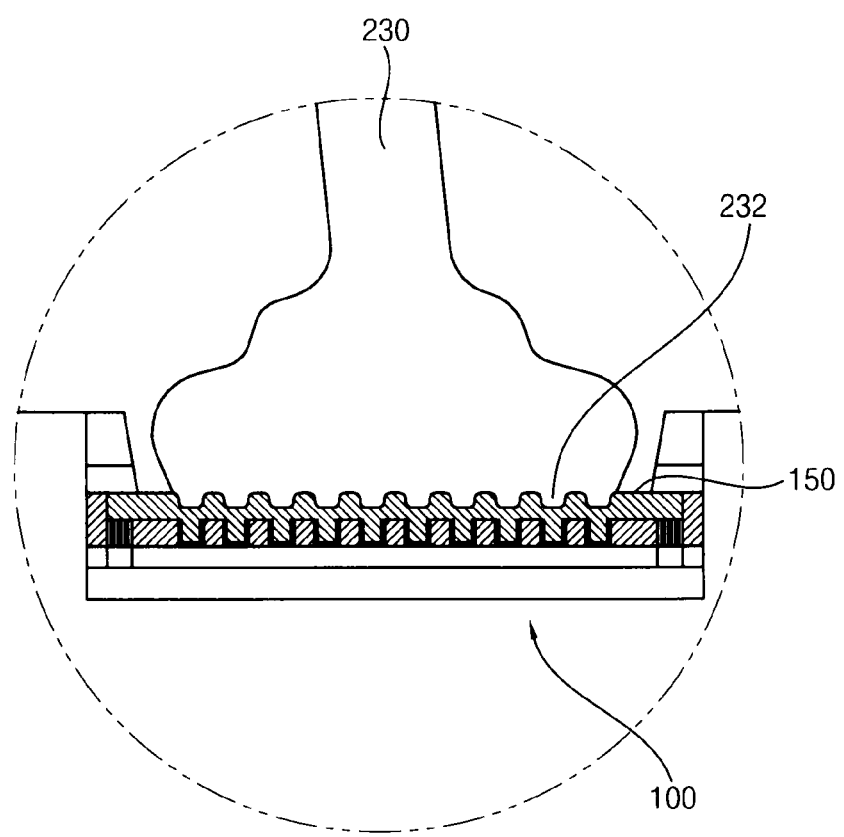
FIG. 20 is an enlarged cross-sectional view of a portion XX of FIG. 19.

FIG. 19 is a cross-sectional view illustrating a semiconductor package 200 including the pad structure of FIG. 1 according to an exemplary embodiment of the present general inventive concept, and FIG. 20 is an enlarged cross-sectional view of a portion XX in FIG. 19.

Referring to FIG. 19, the semiconductor package 200 of the exemplary embodiment may include a package substrate 210, a semiconductor chip 220, a conductive wire 230, a molding member 240 and external terminals 250.

The package substrate 210 may include an insulating substrate (not illustrated), and a circuit pattern 212 in the insulating substrate. The circuit pattern 212 may have an upper end exposed through an upper surface of the package substrate 210, and a lower end exposed through a lower surface of the package substrate 210.

The semiconductor chip 220 may be arranged on the upper surface of the package substrate 210. In an exemplary embodiment, the semiconductor chip 220 may include the pad structure 100 in FIG. 1. The pad 150 may be arranged on an edge portion of an upper surface of the semiconductor chip 220.

In the exemplary embodiment, the semiconductor package 200 may include the conductive wire 230 as a conductive connecting member. The conductive wire 230 may be electrically connected between the pad 150 of the semiconductor chip 220 and the circuit pattern 212 of the package substrate 210. That is, the conductive wire 230 may have an upper end connected to the pad 150 and a lower end connected to the circuit pattern 212.

Referring to FIG. 20, because the recessed portions 154 and the elevated portions 156 may be formed at the upper surface of the pad 150, the conductive wire 230 may have an inserting portion 232 inserted into the recessed portion 154. Thus, the conductive wire 230 may be firmly bonded with the pad 150 by inserting the inserting portion 232 into the recessed portion 154.

The molding member 240 may be formed on the upper surface of the package substrate 210 to cover the semiconductor chip 220 and the conductive wire 230. The molding member 240 may protect the semiconductor chip 220 and the conductive wire 230 from external environments. In an exemplary embodiment, the molding member 240 may include an epoxy molding compound (EMC).

The external terminals 250 may be mounted on the lower surface of the package substrate 210. The external terminals 250 may be electrically connected to the lower ends of the circuit pattern 212. In example embodiments, the external terminals 250 may include solder balls.

In an exemplary embodiment, the semiconductor package 200 may include the pad structure 100 of FIG. 1. However, the present general inventive concept is not limited thereto. It is possible that the semiconductor package 200 may include any one of the pad structure 100a of FIG. 7, the pad structure 100b of FIG. 9, the pad structure 100c of FIG. 11, the pad structure 100d of FIG. 13, the pad structure 100e of FIG. 15 and the pad structure 100f of FIG. 17.

According to the exemplary embodiment, the uneven upper surface of the pad may increase a friction force between the pad and the conductive wire. Further, the uneven upper surface of the pad may enlarge a contact area between the conductive wire and the pad. Therefore, bonding strength between the pad and the conductive wire may be reinforced.

Figure 21:
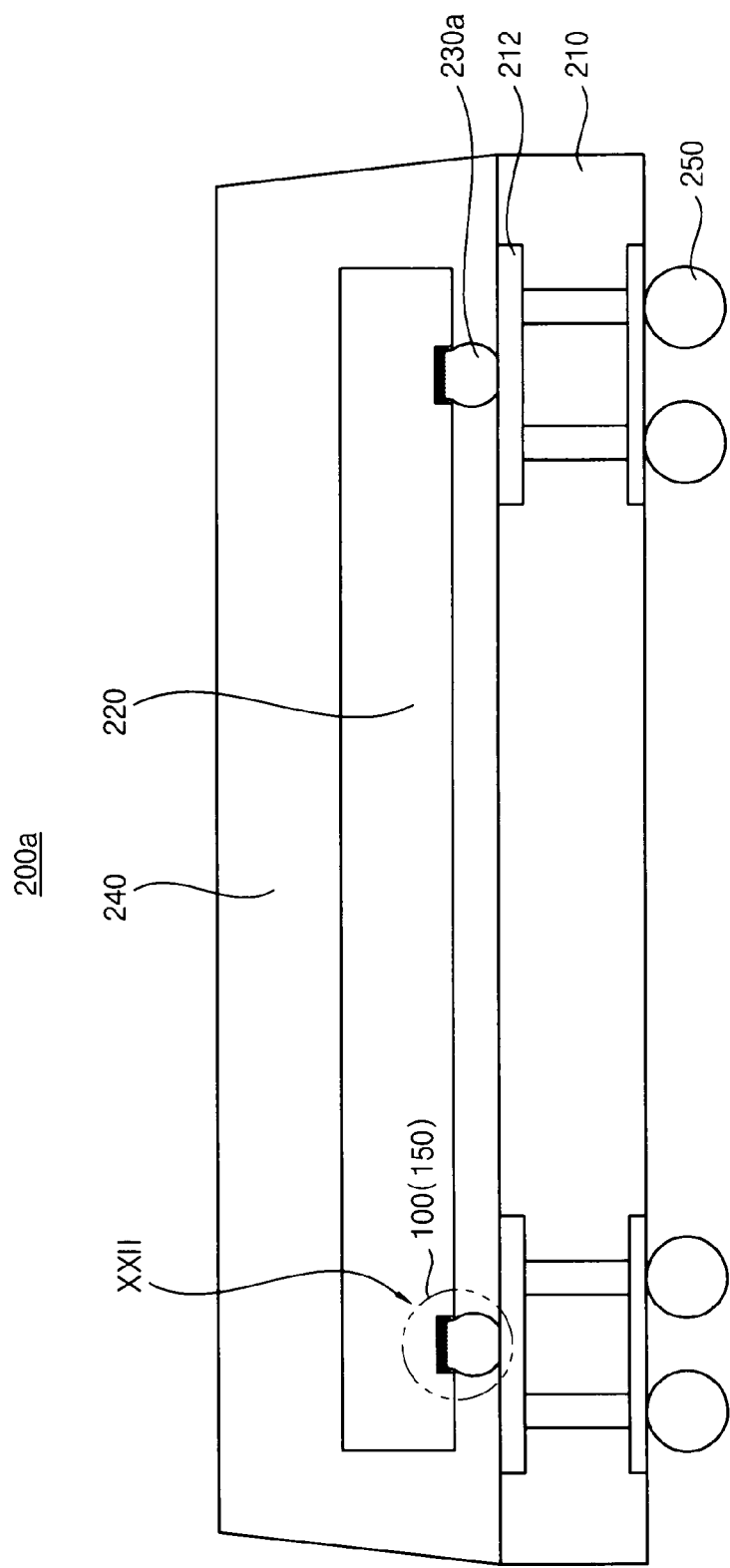
FIG. 21 is a cross-sectional view illustrating a semiconductor package including the pad structure of FIG. 1 according to an embodiment of the present general inventive concept.
Figure 22:
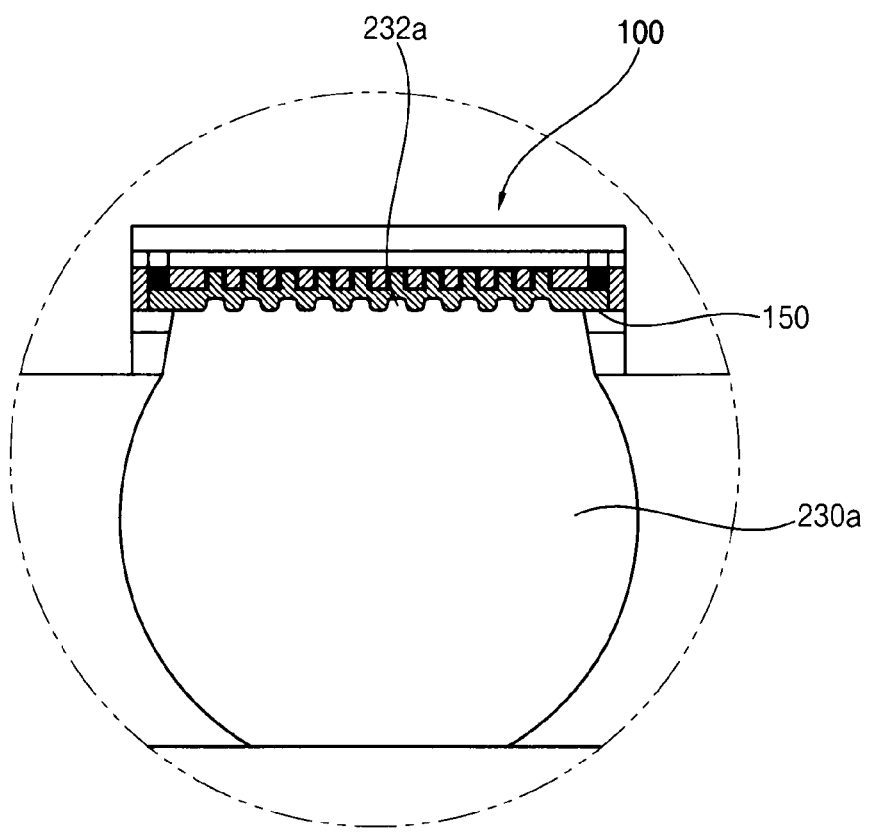
FIG. 22 is an enlarged cross-sectional view of a portion XXII of FIG. 21.

FIG. 21 is a cross-sectional view illustrating a semiconductor package 200a including the pad structure 100 of FIG. 1 according to an exemplary embodiment of the present general inventive concept, and FIG. 22 is an enlarged cross-sectional view of a portion XXII in FIG. 21.

The semiconductor package 200a of the exemplary embodiment may include elements substantially the same as those of the semiconductor package 200 in FIGS. 19 and 20 except for a conductive connecting member. Thus, the same reference numerals may refer to the same elements and any further illustrations with respect to the same element may be omitted herein for brevity.

Referring to FIGS. 21 and 22, the pad 150 of the semiconductor chip 220 may be arranged oriented toward the package substrate 210. That is, the pad 150 may be positioned on an edge portion of the lower surface of the semiconductor chip 220.

Conductive bumps 230a may be arranged between the semiconductor chip 220 and the package substrate 210. The conductive bump 230a may be interposed between the pad 150 and the circuit pattern 212. Thus, each of the conductive bumps 230a may have an inserting portion 232a inserted into the recessed portion 154 of the pad 150.

In the exemplary embodiment, the semiconductor package 200a may include the pad structure 100 of FIG. 1. However, the present general inventive concept is not limited thereto. It is possible that the semiconductor package 200a may include any one of the pad structure 100a of FIG. 7, the pad structure 100b of FIG. 9, the pad structure 100c of FIG. 11, the pad structure 100d of FIG. 13, the pad structure 100e of FIG. 15 and the pad structure 100f of FIG. 17.

According to the exemplary embodiment, the uneven upper surface of the pad may increase a friction force between the pad and the conductive bump. Further, the uneven upper surface of the pad may enlarge a contact area between the conductive bump and the pad. Therefore, bonding strength between the pad and the conductive bump may be reinforced.

According to the exemplary embodiment, the upper surface of the pad may have the recessed portion of the elevated portion having the arrangement corresponding to the arrangement the arrangement of the via hole in the insulating layer pattern structure. Thus, the uneven upper surface of the pad may have high roughness, so that the conductive connecting member may be firmly connected to the uneven upper surface of the pad. Particularly, because the uneven upper surface of the pad may increase a contact area between the pad and the conductive connecting member, a firm connection between the pad and the conductive connecting member may be ensured.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A pad structure of a semiconductor device, the pad structure comprising:
   an insulating layer pattern structure having a plug hole and at least one via hole;
   a plug formed in the plug hole; and
   a pad formed on the insulating layer pattern structure and on the plug, such that the pad is directly connected to the plug, wherein the pad includes a first surface having a protruded portion filling the via hole and a second surface opposite to the first surface, the second surface having a recessed portion and an elevated portion corresponding to a location of the protruded portion.

2. The pad structure of claim 1, wherein the recessed portion is arranged in a direction substantially parallel to side surfaces of the pad, and the elevated portion is surrounded by the recessed portion.

3. The pad structure of claim 1, wherein the recessed portion and the elevated portion form a channel on the second surface of the pad such that a length of the channel is arranged at a slant with respect to side surfaces of the pad.

4. The pad structure of claim 3, wherein the slant recessed portion has a width substantially the same as that of the slant elevated portion.

5. The pad structure of claim 3, wherein the slant recessed portion has a width greater than that of the slant elevated portion.

6. The pad structure of claim 1, wherein the elevated portion includes at least two elevated portions symmetrically arranged in a length direction on each side of a center point of the pad, and at least two elevated portions symmetrically arranged in a width direction on each side of the center of the pad.

7. The pad structure of claim 6, wherein the elevated portion is extended to adjacent side surfaces of the pad.

8. The pad structure of claim 1, wherein the pad further comprises a second recessed portion formed at a central portion of the pad, and the second recessed portion is surrounded by the elevated portion.

9. The pad structure of claim 1, wherein the recessed portion is symmetrically arranged with respect to a center point of the pad.

10. The pad structure of claim 1, wherein the plug is formed on an inner surface of the via hole.

11. The pad structure of claim 1, wherein the insulating layer pattern structure is disposed on a substrate comprising a structure on an upper surface thereof, and the plug hole is formed to expose an upper surface of the structure.

12. The pad structure of claim 1, wherein the insulating layer pattern structure is disposed on a substrate comprising a structure on an upper surface thereof, and the plug is formed in the plug hole of the insulation layer pattern structure between the pad and the substrate.

13. The pad structure of claim 1, wherein the upper surface of the pad disposed over the plug is flat.

\* \* \* \* \*